United States Patent
Oda et al.

(10) Patent No.: US 8,390,248 B2
(45) Date of Patent: Mar. 5, 2013

(54) ELECTRIC POWER CONVERSION APPARATUS AND MANUFACTURING METHOD FOR THE APPARATUS

(75) Inventors: Shoichiro Oda, Yokohama (JP); Hideki Asato, Yokohama (JP)

(73) Assignee: Kyocera Corporation, Kyoto (JP)

( * ) Notice: Subject to any disclaimer, the term of this patent is extended or adjusted under 35 U.S.C. 154(b) by 276 days.

(21) Appl. No.: 12/671,494

(22) PCT Filed: Jul. 29, 2008

(86) PCT No.: PCT/JP2008/063605
§ 371 (c)(1),
(2), (4) Date: Apr. 14, 2010

(87) PCT Pub. No.: WO2009/017132
PCT Pub. Date: Feb. 5, 2009

(65) Prior Publication Data
US 2010/0201325 A1      Aug. 12, 2010

(30) Foreign Application Priority Data
Jul. 30, 2007    (JP) ................................. 2007-198161

(51) Int. Cl.
*H01M 10/44* (2006.01)
*H01M 10/46* (2006.01)
(52) U.S. Cl. ...................................... 320/107

(58) Field of Classification Search ................... 320/107, 320/114, 115, 137, 150, 153
See application file for complete search history.

(56) References Cited

U.S. PATENT DOCUMENTS
2005/0162133 A1 * 7/2005 Aisenbrey ..................... 320/128

FOREIGN PATENT DOCUMENTS

| | | |
|---|---|---|
| JP | 57-192786 | 12/1982 |
| JP | 62-172286 | 10/1987 |
| JP | 08-182324 | 7/1996 |
| JP | 2000-050617 | 2/2000 |
| JP | 2000-078849 | 3/2000 |
| JP | 2003-158393 | 5/2003 |

OTHER PUBLICATIONS

International Search Report for PCT/JP2008/063605, mailed on Oct. 21, 2008, 2 pages.

* cited by examiner

*Primary Examiner* — Edward Tso
(74) *Attorney, Agent, or Firm* — Duane Morris LLP

(57) ABSTRACT

The electric power conversion apparatus 110 according to the present invention comprises an electric power conversion module 150 for converting electric power from the commercial power supply 112 to converted electric power, a filler container 152 for accommodating said electric power conversion module 150, and a filler 154 with which said filler container 152 is filled, said filler having electric non-conductance and directly embracing said electric power conversion module 150, wherein the melting point of said filler 154 is equal to or lower than a temperature of said electric power conversion module 150 achieved by electric power conversion.

6 Claims, 9 Drawing Sheets

FIG. 7A
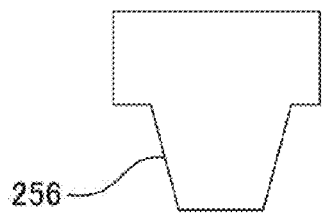
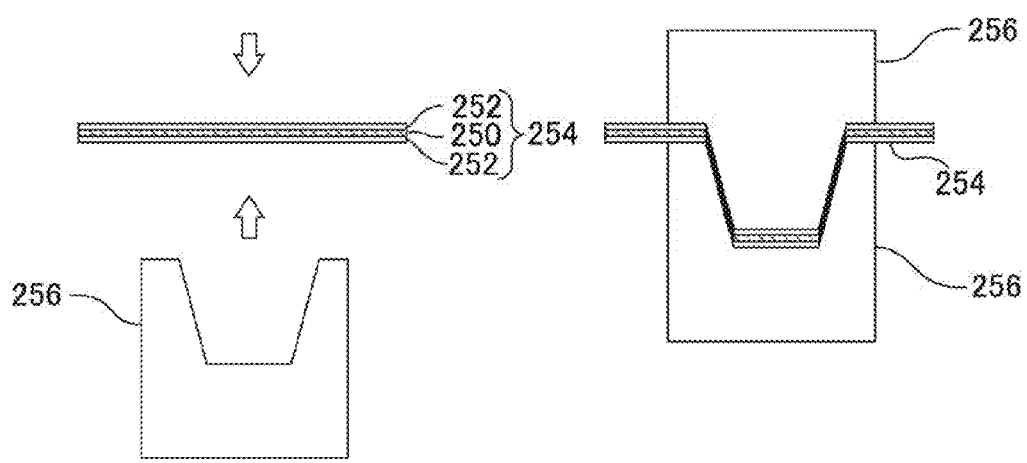
FIG. 7B
FIG. 7C
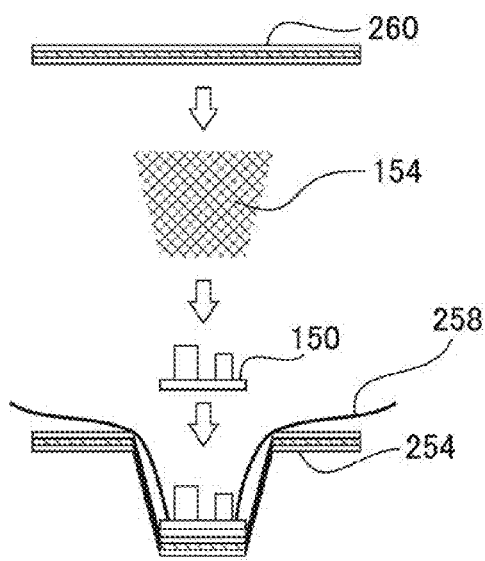
FIG. 7D
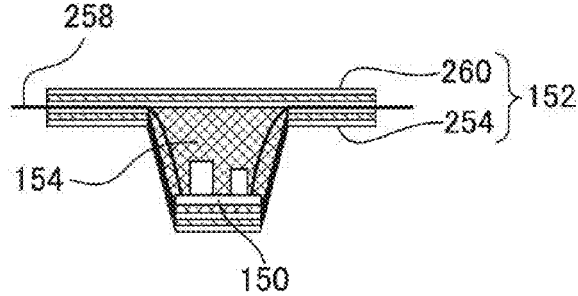

ELECTRIC POWER CONVERSION APPARATUS AND MANUFACTURING METHOD FOR THE APPARATUS

CROSS-REFERENCE TO RELATED APPLICATIONS

This is a U.S. National Phase Application of International Application No. PCT/JP2008/063605 filed Jul. 29, 2008, which claims priority to Japanese Patent Application No. 2007-198161 filed Jul. 30, 2007, the disclosures of which are incorporated herein by reference in their entirety.

BACKGROUND OF THE INVENTION

The present invention relates to an electric power conversion apparatus for converting electric power from the commercial power supply to converted electric power and to a manufacturing method for the apparatus.

Today, it is known that an electric power conversion apparatus such as an AC adapter can convert electric power from the commercial power supply and transmit the converted electric power to an electronic device such as cell phone, Personal Handy phone System (PHS) or Personal Digital Assistant (PDA).

However, converting electric power from the commercial power supply causes a heat generation. In order to radiate the heat generated by an electric power conversion apparatus etc., a heat sink is used for broadening a radiation area which radiates the heat outside, as known in the art (See Patent Document 1, for example).

Patent Document 1: Japan Laid Open Patent 1996-182324

However, when using such a heat sink of the prior art, it would be necessary to enlarge the heat sink in accordance with the increasing amount of heat generated by the electric power conversion. This leads to a problem that the size of the electric power conversion apparatus is too large.

The present invention attempts to solve the problem of the prior art. The object of the present invention is to provide a new electric power conversion apparatus and a manufacturing method for the apparatus. According to the invention, by forming a simple heat-absorbing structure using heat of fusion, the apparatus can control, without enlarging the size of the apparatus, the temperature rise caused by the increasing amount of heat generated by the electric power conversion.

In order to solve the above problems, according to an aspect of the present invention, an electric power conversion apparatus comprises: an electric power conversion module for converting electric power from the commercial power supply to converted electric power; a filler container for accommodating said electric power conversion module; and a filler with which said filler container is filled, said filler having electric non-conductance and directly embracing said electric power conversion module; wherein the melting point of said filler is equal to or lower than a temperature of said electric power conversion module achieved by electric power conversion.

The apparatus may further comprises: a temperature detector for detecting temperature of said filler; a controller for reducing output of electric power from said electric power conversion module when temperature detected by said temperature detector is equal to or higher than the melting point of said filler and is also higher than the first temperature which is equal to or lower than the boiling point.

Said controller may further restart the output of electric power when the temperature detected by said temperature detector is equal to or lower than the second temperature which is equal to or lower than the melting point of said filler, under the condition that the output of electric power is reduced.

Said controller may change the second temperature in accordance with voltage of a secondary battery to which the converted electric power is supplied, when the temperature detected by said temperature detector is higher than the first temperature.

Said electric power conversion module may be provided with frames for securing a volume of said filler which reaches every circuit on the main surface of said electric power conversion module.

The converted electric power may be electric power for charging a secondary battery.

In order to solve the above problems, according to another aspect of the present invention, a manufacturing method for an electric power conversion apparatus comprises: a step for creating a filler container; a step for accommodating by the filler container an electric power conversion module for converting electric power from the commercial power supply to converted electric power; a step for filling the filler container, which accommodates the electric power conversion module, with a filler having electric non-conductance; and a step for sealing the filler container.

EFFECTS OF THE INVENTION

As explained above, according to the present invention, by forming a simple heat-absorbing structure using heat of fusion, the electric power conversion apparatus can control, without enlarging the size of the apparatus, the temperature rise caused by the increasing amount of heat generated by the electric power conversion.

BRIEF EXPLANATION OF THE DRAWINGS

FIGS. 7A to 7D are schematic views illustrating a process for forming a filler container.

EXPLANATION OF REFERENCE NUMERALS

Figure 1:
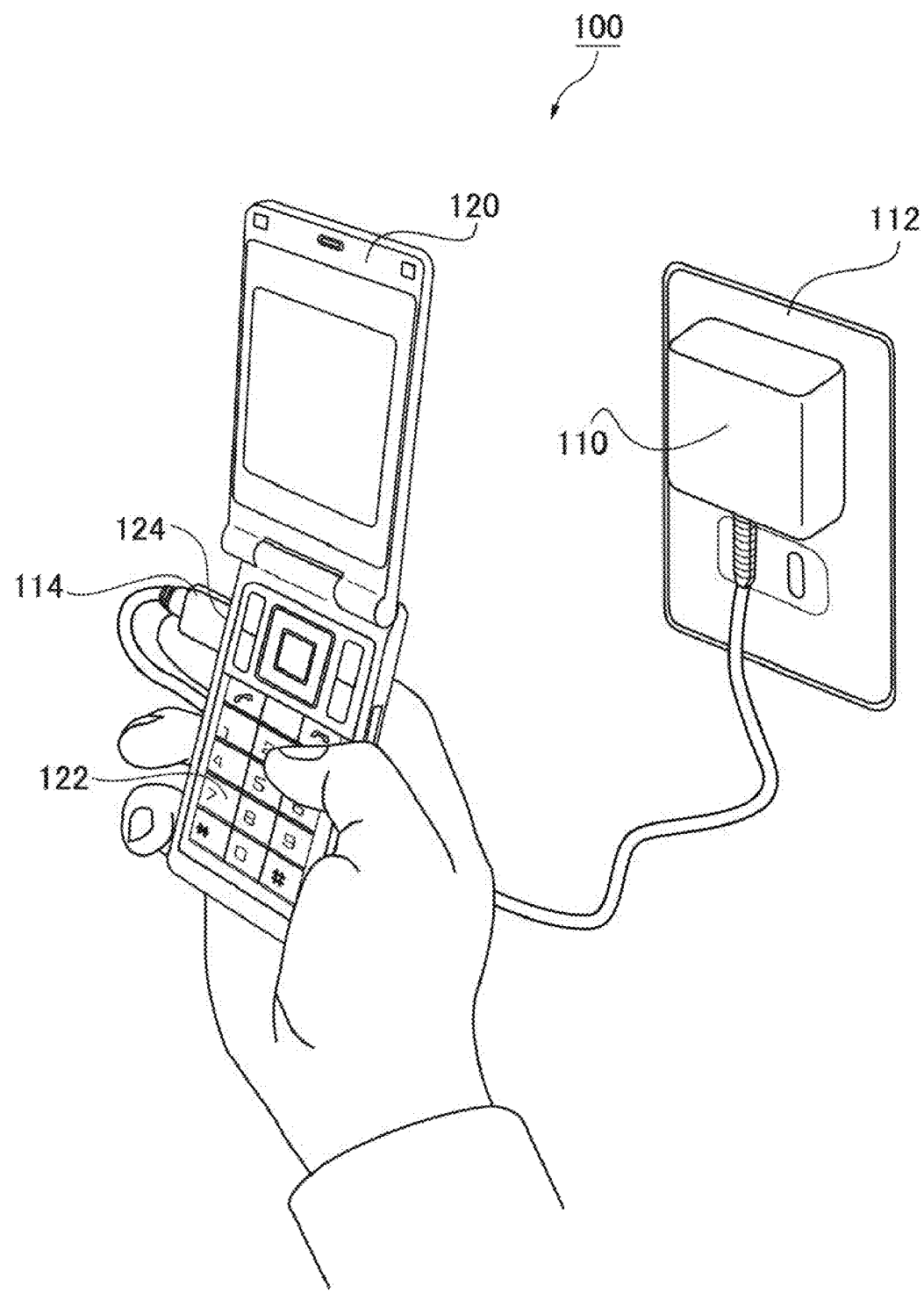
FIG. 1 is a schematic perspective view of an electric power supply system.

110 Electric power conversion apparatus
112 Commercial power supply
120 Mobile terminal
124 Secondary battery
150 Electric power conversion module
152 Filler container
154 filler
156 Temperature detector
158 Voltage meter
160 Controller 162 Housing
254, 260 laminating film
270 frame

BEST MODE FOR CARRYING OUT THE INVENTION

The best embodiments for realizing the present invention will be explained in detail below with reference to the accompanying drawings. In the present description and drawings, the structural elements which have essentially the same functional structure are indicated by the same reference numerals in order to omit overlapping explanations.
(Electric Power Supply System 100)

It is preferable to give a higher capacity and a higher output voltage to a secondary battery such as a Lithium ion battery used in an electronic device such as a mobile terminal. However, in order to charge such a secondary battery more rapidly, a battery charger (electric power conversion apparatus) capable of charging the secondary battery with charging current of more than 10 C is needed, for example.

In the present embodiment, heat generated by such a large amount of charging current supplied to an electronic device is not only radiated into the air but also absorbed by a heat storage material of lower melting point. In this way, without enlarging the size of the electric power conversion apparatus, a large amount of charging current can be supplied to the secondary battery, and the volume of the electric power conversion apparatus can be reduced. In the following, in order to understand the present embodiment easily, the whole structure of an electric power supply system including an electric power conversion apparatus will be described initially. After that, features of the electric power conversion apparatus will be described in detail.

FIG. 1 is a schematic perspective view of an electric power supply system 100. The electric power supply system 100 comprises an electric power conversion apparatus 110 and a mobile terminal 120.

The electric power conversion apparatus 110 receives AC 100 V power from the commercial power supply 112. The supplied power may also be 100 to 240 V, for example, in accordance with a country. The apparatus 110 converts the received AC power to DC power and supplies the converted DC power, for example effective DC 5V, to the mobile terminal 120. In the present embodiment the electric power conversion apparatus 110 is used for a battery charger for charging the secondary battery rapidly. However, the apparatus 110 may also be used for other things such as an AC adapter which can handle a sudden overload during a continuous power supply.

In the present embodiment, the electric power conversion apparatus 110 is an adapter which is directly connected to the commercial power supply 112. However, the apparatus 110 may be replaced with other types of adapter, such as an adapter with a plug (socket) to be connected to the commercial power supply 112, or a so-called cradle which fixes the mobile terminal 120 with a latch and supplies electric power to the fixed terminal 120. In the present embodiment, the electric power conversion apparatus 110 is separated from the mobile terminal 120, but the apparatus 110 may also be integrated into the mobile terminal 120. The electric power conversion apparatus 110 can charge not only the mobile terminal 120 but also another object which needs electric power supply (an electric car which needs to be charged rapidly, for example).

The mobile terminal 120 may be not only the above-stated devices such as a cell phone, PHS and PDA, but also various portable electronic devices such as a note type personal computer. In the present embodiment, a cell phone is adopted for the mobile terminal 120 for easy understandings of the embodiment. The mobile terminal 120 is provided with a detachable secondary battery (not shown in FIG. 1) on the rear side of the operation unit 122. The mobile terminal 120 has a connector 124 corresponding to the plug 114 extended from the electric power conversion apparatus 110. The terminal 120 receives from the connector 124 electric power converted by the electric power conversion apparatus 110 and charges the secondary battery.

The secondary battery stores a partial amount of the converted power from electric power conversion apparatus 110 and, after the mobile terminal 120 is unconnected to the electric power conversion apparatus 110, supplies power to each circuit in the mobile terminal 120. For the secondary battery, a Lithium ion battery or a Nickel-Metal Hydride battery can be used typically.
(Electric Power Conversion Apparatus 110)

The present embodiment is characterized that it encloses a phase transition material in the above-stated electric power conversion apparatus 110 and temporarily stores heat necessary for phase transition of the phase transition material. Accordingly, the phase transition material functions as a so-called heat buffer which carries out heat-absorption for a short time period only when a rapid heat-radiation is needed and carries out heat-radiation when a rapid heat-radiation is not needed.

Figure 2:
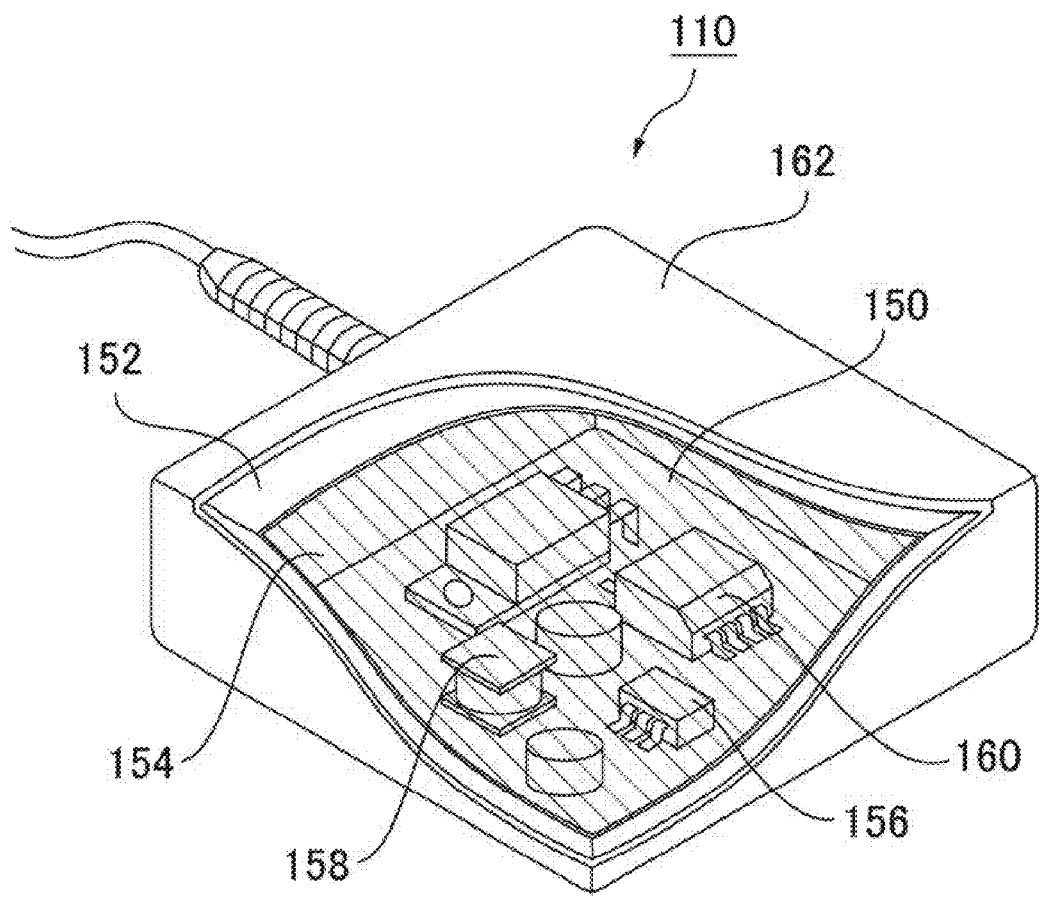
FIG. 2 is a transparent view of an electric power conversion apparatus of the present invention.

FIG. 2 is a schematic transparent view of an electric power conversion apparatus 110. The electric power conversion apparatus 110 comprises an electric power conversion module 150, a filler container 152, a filler 154, a temperature detector 156, a voltage meter 158 a controller 160 and a housing 162.

The electric power conversion module 150 converts electric power from the commercial power supply 112 into converted electric power with which the secondary battery of the mobile terminal 120 can be charged. The electric power conversion module 150 may be formed, as shown in FIG. 2, as a substrate on which circuits for electric power conversion are arranged, and the circuits on the substrate may be connected by any type of connecting means.

Figure 3:
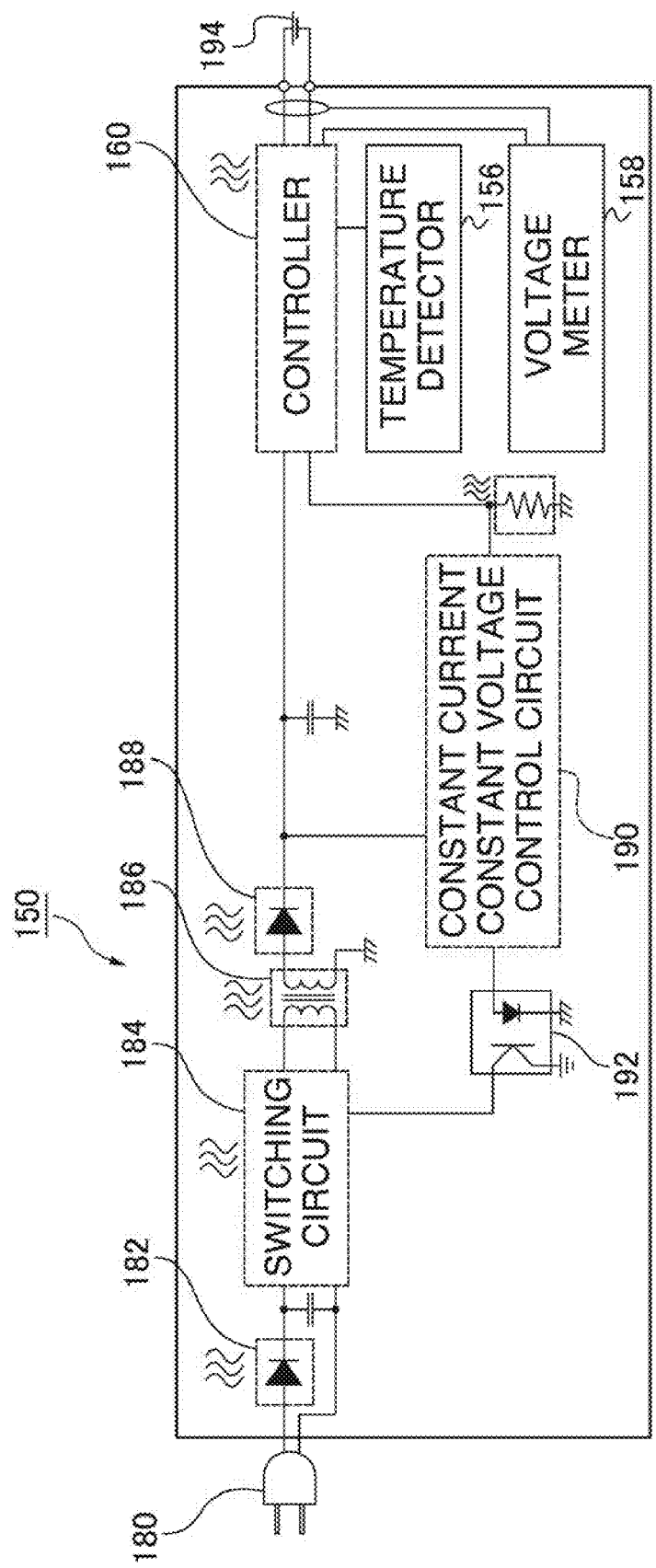
FIG. 3 is a circuit diagram of an electric power conversion module.

FIG. 3 is a circuit diagram of the electric power conversion module 150. In the electric power conversion module 150, AC electric power input from a connection plug 180 is rectified by a rectifier 182 and further converted by a switching circuit 184 into a pulsed power with a desirable pulse width. The pulsed power is then transformed by a transformer 186 and rectified by a rectifier 188 into DC power. A constant current constant voltage control circuit 190 detects the rectified DC power and feeds it back to the switching circuit 184 so that a constant voltage and a constant current are output. A photo-coupler 192 is used, as well as the transformer 186, to insulate the circuit 190 from the commercial power supply 112. The output of electric power from the circuit 190 is supplied by way of the controller 160 to the secondary battery 194. The functions of the controller 160 and the temperature detector 156 are explained later.

In FIG. 3, circuits illustrated by dotted lines generate heat when electric power is converted. The amount of heat generated is increased gradually in accordance with the increasing amount of current to be converted. So, when a larger amount of electric power is converted in order to shorten the charge time, the amount of heat generated is larger accordingly.

The filler container 152 accommodates the electric power conversion module 150 and is filled with the filler 154. Then the electric power conversion module 150 and filler 154 are confined in the container 152 by sealing the container 152.

The filler container 152 is made of synthetic resin. Since the synthetic resin can be processed easily and can be transformed though the filler 154 is accommodated therein, it can be transformed flexibly in accordance with transformation of the melting filler 154. The container 152 may be made also of a natural material instead of the synthetic resin. In the case that the housing 162 has sufficient air tightness, the housing 162 can be regarded as the filler container 152 of the present embodiment.

The filler 154 has electric non-conductance and directly embraces the electric power conversion module 150. When the filler container 152 is filled with a desirable amount of the filler 154, the container 152 is sealed for example by thermo compression bonding.

When performing phase transition, the filler 154 can rapidly absorb heat generated by the electric power conversion module 150. Since the volume of the filler 154 is changed little when it melts, if the heat-absorption is carried out by the filler 154 melting, the electric power conversion apparatus 110 can supply a large amount of current to the mobile terminal 120 without changing a shape and a usual volume of the apparatus 110.

It is preferable that the melting point of the filler 154 is equal to or higher than an environmental temperature of the electric power conversion apparatus 110, and is equal to or lower than a temperature of the electric power conversion module 150 achieved by electric power conversion.

Since the present embodiment uses heat of fusion, it is preferable that the melting point of the filler 154 is reached by heat generated when a large amount of current is supplied. Therefore, in order not to melt the filler 154 too early under the environmental temperature, the melting point of the filler 154 should be equal to or higher than the environmental temperature, and should further be equal to or lower than a temperature reachable by electric power conversion i.e. within the heat variation range. The reason why the melting point is defined by the environmental temperature is because the heat variation range of the melting point can be changed in accordance with an environment such as an air temperature dependent on country, region, indoor place and outdoor place.

In order to make the above-stated melting point to be equal to or higher than the environmental temperature of the electric power conversion apparatus 110 and further to be equal to or lower than a temperature of the electric power conversion module 150 reachable by electric power conversion, the melting point may be in the range from about 40 degrees centigrade to about 60 degrees centigrade, more preferably in the range from about 50 degrees centigrade to about 60 degrees centigrade. The melting point may also be equal to or higher than 60 degrees centigrade.

For universal use of the electric power conversion apparatus 110, the melting point should be set to the temperature equal to or higher than 40 degrees centigrade, more preferably equal to or higher than 50 degrees centigrade, in order to avoid the dependence on region or season. Although each circuit in the electric power conversion module 150 has a 100 degrees centigrade or more heat tolerance generally, if the amount of generated heat were too large, the heat would be transmitted to the housing 162 and a user would have a feeling of wrongness when he/she touches the housing 162. So, in the present embodiment, the melting point is set to 60 degrees centigrade, though an upper limit of the melting point may be greater than 60 degrees centigrade, in order to maintain a low temperature of outer surface of the electric power conversion apparatus 110.

In the present embodiment, the filler 154 is alpha-olefin polymer which has a side-chain of crystalline. Alpha-olefin polymer has a melting point for example of 53 degrees centigrade, which is within the range of 40 to 60 degrees centigrade. Alpha-olefin polymer also has a narrow fusion temperature variation range at the amount of heat of fusion more than 100 J/g. That is to say, rapid heat-absorption can be carried out around the melting point.

Besides, since alpha-olefin polymer has a weight loss temperature equal to or higher than 300 degrees centigrade for example, it is not dissolved even if the temperature of the filler exceeds the melting point. Moreover, since the volume of alpha-olefin polymer is little changed regardless of its phase, solid or liquid, the filler container 152 can absorb the volume change even if the container 152 is small. Since alpha-olefin polymer can be dissolved in an inexpensive low-molecular-weight solvent such as toluene, methyl-cyclohexan or heptan, it is easy to wash the container 152 in the manufacturing process and it is possible to reduce the manufacturing costs. The filler 154 may also be, instead of alpha-olefin polymer, a phase transition material made of highly polymerized materials such as paraffin or plastic.

The volume of the filler 154 is determined so that at least one secondary battery 194 can be charged one time. For example, in the case of a recently proposed Titanium Lithium ion battery of 600 mAh, the amount of energy required for one hour charge is calculated as $5 V \times 6 A$ (with charging current of $10 C) \times 6 min \times 60 sec = 10800 J$. On the assumption that the efficiency of power conversion is 80%, the amount of energy loss is calculated as $10800/0.8 \times 0.2 = 2700 J$. So, the amount of heat generated per unit time is calculated as $2700 J/(6 min \times 60 sec) = 7.5 W$. As a result, in order to charge one secondary battery one time, it is preferable to set the heat storage capacity Q of the filler to be equal to or greater than 2700 J.

In the case of using alpha-olefin polymer stated above as the filler 154, the amount of heat of fusion is equal to or more than 100 J/g, for example. Accordingly, in order to absorb energy loss of 2700 J, alpha-olefin polymer of $2700/100=27$ g is required. Taking account of the specific gravity $0.9 g/cm^3$ of alpha-olefin polymer, the volume of alpha-olefin polymer of $27/0.9=30 cm^3$ is needed. This volume can be accommodated in a parallelepiped with the conventional size 4 by 4 by 2 centimeters. By using the filler 154 of such volume, the secondary battery 194 can be full charged. In the following, the temperature of the filler 154 caused by charging is explained.

Figure 4:
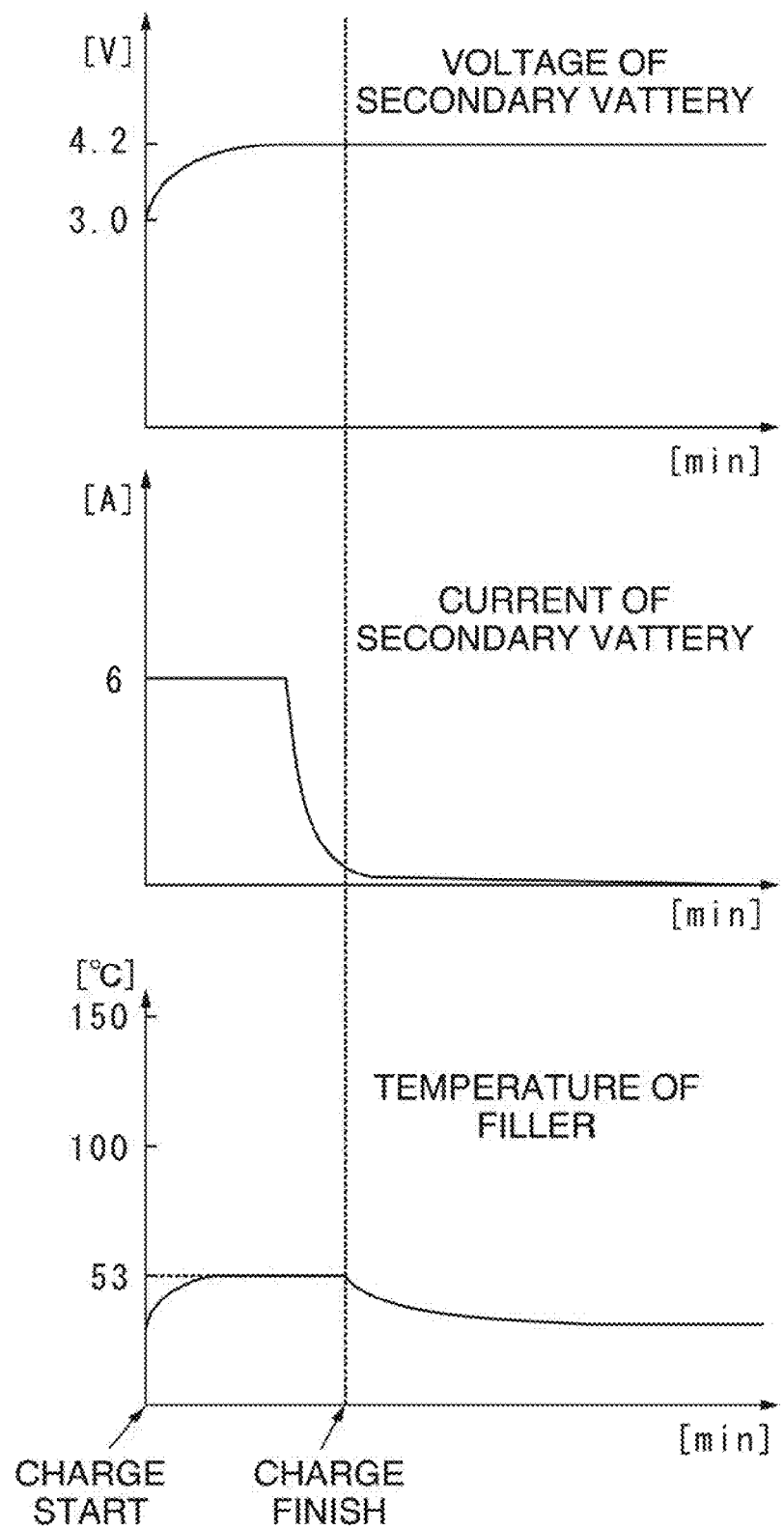
FIG. 4 is a time series chart illustrating the temperature of filler during a secondary battery charge.

FIG. 4 is a time series chart illustrating the temperature of the filler 154 during a secondary battery charge. In the present embodiment, the battery is charged with a constant current and a constant voltage output by the constant current constant voltage control circuit 190. FIG. 4 shows voltage and current of the secondary battery 194 and temperature of the filler 154 in a normal one time charge.

For example, on the assumption that voltage of the secondary battery 194 is lowered to 3 V, voltage at the charge start timing is 3 V and is raised to 4.2 V when the battery is full-charged. The battery charge is continued until charging current is lowered to a predetermined value. Charging current at the charge start timing is 10 C, which is a constant current of 6 A. Joule heat generated by such charging current is absorbed by the filler 154. Since the present embodiment uses the filler 154 with the melting point of 53 degrees centigrade, when temperature of the filler 154 reaches 53 degrees centigrade, this constant temperature is maintained. During this constant temperature, the filler 154 in the filler container 152 is in the melting condition (solid and liquid mixed condition). When the constant current condition is finished, charging current is decreased lower than 6 A, fusion of the filler 154 stops, and after a certain time, temperature is decreased, too.

The temperature detector 156 is provided on the electric power conversion module 150 and detects temperature (atmospheric temperature) of the filler 154 around it. The voltage meter 158 measures voltage of the secondary battery 194.

The controller 160 is provided on the electric power conversion module 150. The controller 160 reduces the output of electric power from the electric power conversion module when the temperature detected by the temperature detector 156 is equal to or higher than the melting point of the filler 154 and is also higher than the first temperature which is equal to or lower than the boiling point. The controller 160 further restarts the output of electric power when the temperature detected is equal to or lower than the second temperature which is equal to or lower than the melting point. In the present embodiment, a weight loss temperature of the filler is a high value 300 degrees centigrade and therefore it does not matter. However, if a weight loss temperature of the filler were a low value, it would be necessary to set the first temperature to be equal to or lower than the weight loss temperature in order not to dissolve the filler 154.

Figure 5:
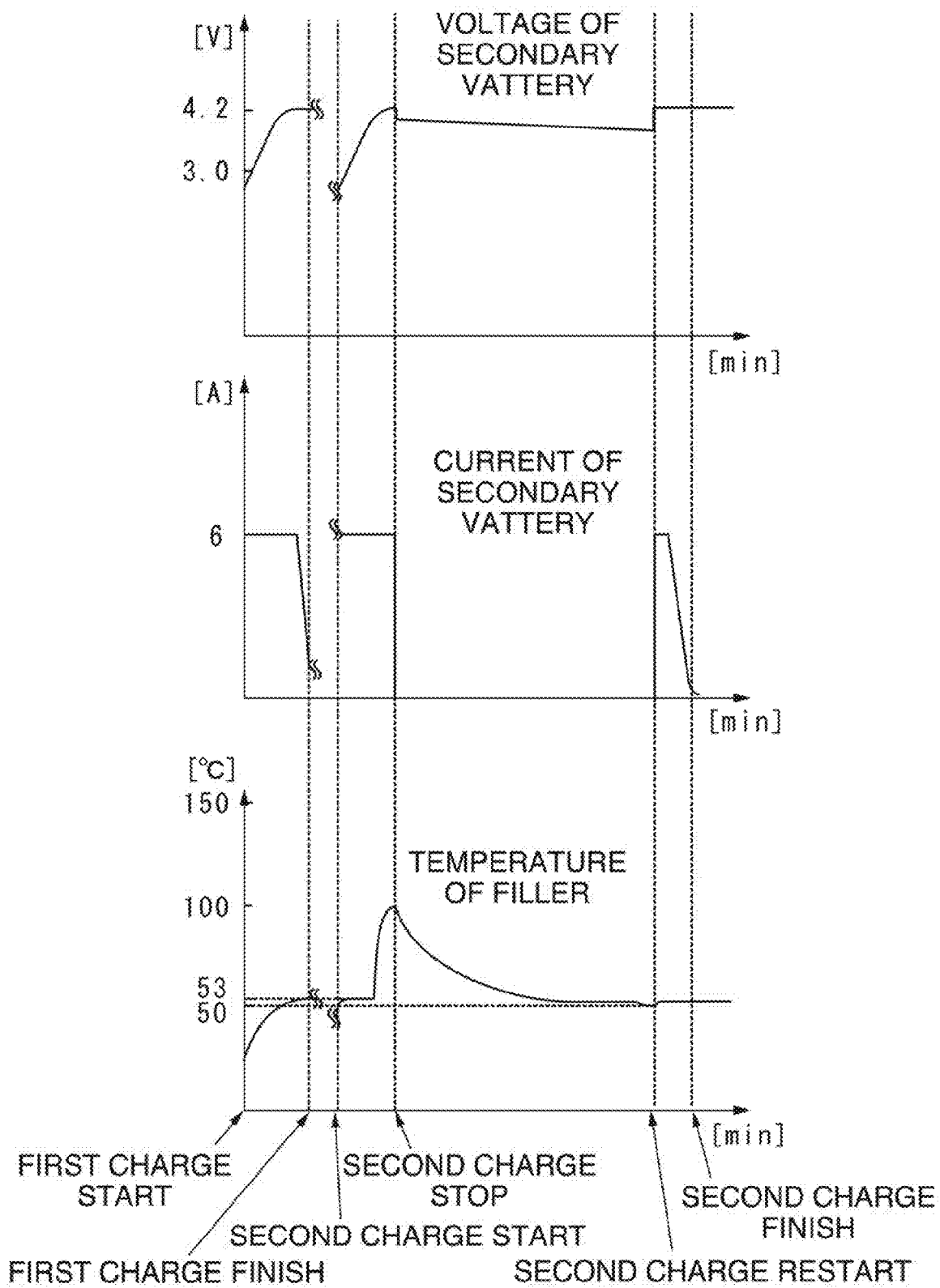
FIG. 5 is a time series chart illustrating the temperature of filler during another battery charge.

FIG. 5 is a time series chart illustrating the temperature variation of the filler 154 during another battery charge different from that of FIG. 4. Also in the case of FIG. 5, a constant current constant voltage charge is carried out by the constant current constant voltage control circuit 190. FIG. 5 shows, as well as FIG. 4, voltage and current of the secondary battery 194 and temperature of the filler 154 in a normal one time charge.

For example, assuming that, after the first charge is finished, the second charge starts for charging another secondary battery. Because of the first charge, at the first charge finish timing, the filler 154 is in the melting condition (solid and liquid mixed condition). When the second charge starts, the filler 154 further absorbs heat. Then, when all the solid filler is melted to be liquid i.e. when heat-absorption (heat storage) capacity of the filler 154 is saturated, temperature of the filler 154 restarts rising from the constant temperature of 53 degrees centigrade. When the temperature reaches the first temperature, for example of 100 degrees centigrade, the controller 160 stops (reduces) the charge. Then, because of a decrease of charging current, temperature of the filler 154 starts decreasing. When the temperature decreases back to the second temperature for example of 50 degrees centigrade, the controller 160 restarts the second charge.

When temperature of the filler 154 reaches the first temperature, in accordance with voltage of the another secondary battery measured by the voltage meter 158 (under the charging condition), the controller 160 may change a value to which the second temperature is set. For example, the controller 160 may set the second temperature to a high value (for example 70 degrees centigrade) in the case that voltage of the another secondary battery is equal to or higher than a prescribed value (nearly equal to a value of full-charged condition, for example) when temperature of the filler 154 reaches the first temperature. On the other hand, the controller 160 may also set the second temperature to a low value (for example 50 degrees centigrade) in the case that voltage of the another secondary battery is lower than the prescribed value. According to the above manner, in the case that voltage of the another secondary battery measured by the voltage meter 158 is equal to or higher than the prescribed value when temperature of the filler 154 reaches the first temperature, the battery charge restarts before temperature of the filler 154 is lowered. Therefore, the battery charge is carried out more rapidly, while the battery charge stops automatically when the another secondary battery is full charged. So, a rise of temperature of the filler 154 can be controlled preferably. Besides, in the case that voltage of the another secondary battery measured by the voltage meter 158 is lower than the prescribed value when temperature of the filler 154 reaches the first temperature, the battery charge restarts after temperature of the filler 154 is sufficiently lowered. So, a rise of temperature of the filler 154 can be controlled preferably also in this case.

If heat is continuously applied, by means of such two time charges, to the filler 154 even after the fusion of the filler 154 started, the filler 154 is completely melted to be liquid and temperature of the filler may reach the boiling point. At the boiling point, a volume change of 1,000 times is carried out, for example. If the filler container 152 and the housing 162 described later were structured to allow such a volume change, it would cost too much. Therefore, the present embodiment uses only fusion of the filler which causes little shape change, by reducing or stopping the output of electric power at the first temperature equal to or lower than the boiling point. Then, at the second temperature by which the filler 154 can be rapidly back to a solid phase which is capable of heat-absorption, the output of electric power is restarted. According to the above structure, heat generated by electric power conversion can be radiated safely and efficiently.

In the present embodiment, the first temperature is set to 100 degrees centigrade, which is higher than the melting point, 53 degrees centigrade, of the filler 154. However, in the present embodiment, the first temperature is not confined to the above value but may also be set for example to 54 to 55 degrees centigrade, which is calculated by adding a margin a (1 to 2 degrees centigrade) to the melting point, 53 degrees centigrade, of the filler 154. Because of this, temperature of the filler 154 is prevented from rising to a temperature equal to or more than the melting point. Therefore, a feeling of wrongness felt by a user when he/she touches the housing 162 is reduced.

The housing 162 formed of a resin such as plastic protects the filler container 152 which is filled with the filler 154 against external pressure. Since the resin such as plastic has a specific heat far smaller than those of metals, even when temperature of the electric power conversion module 150 inside becomes higher, heat is not so much transmitted to the outer face of the housing 162. Accordingly, even when temperature of the filler 154 becomes 60 degrees centigrade, a user would not have so much feeling of wrongness when he/she touches the housing 162.

(Manufacturing Method for the Electric Power Conversion Apparatus)

In the following, a manufacturing method for the electric power conversion apparatus 110 is explained.

Figure 6:
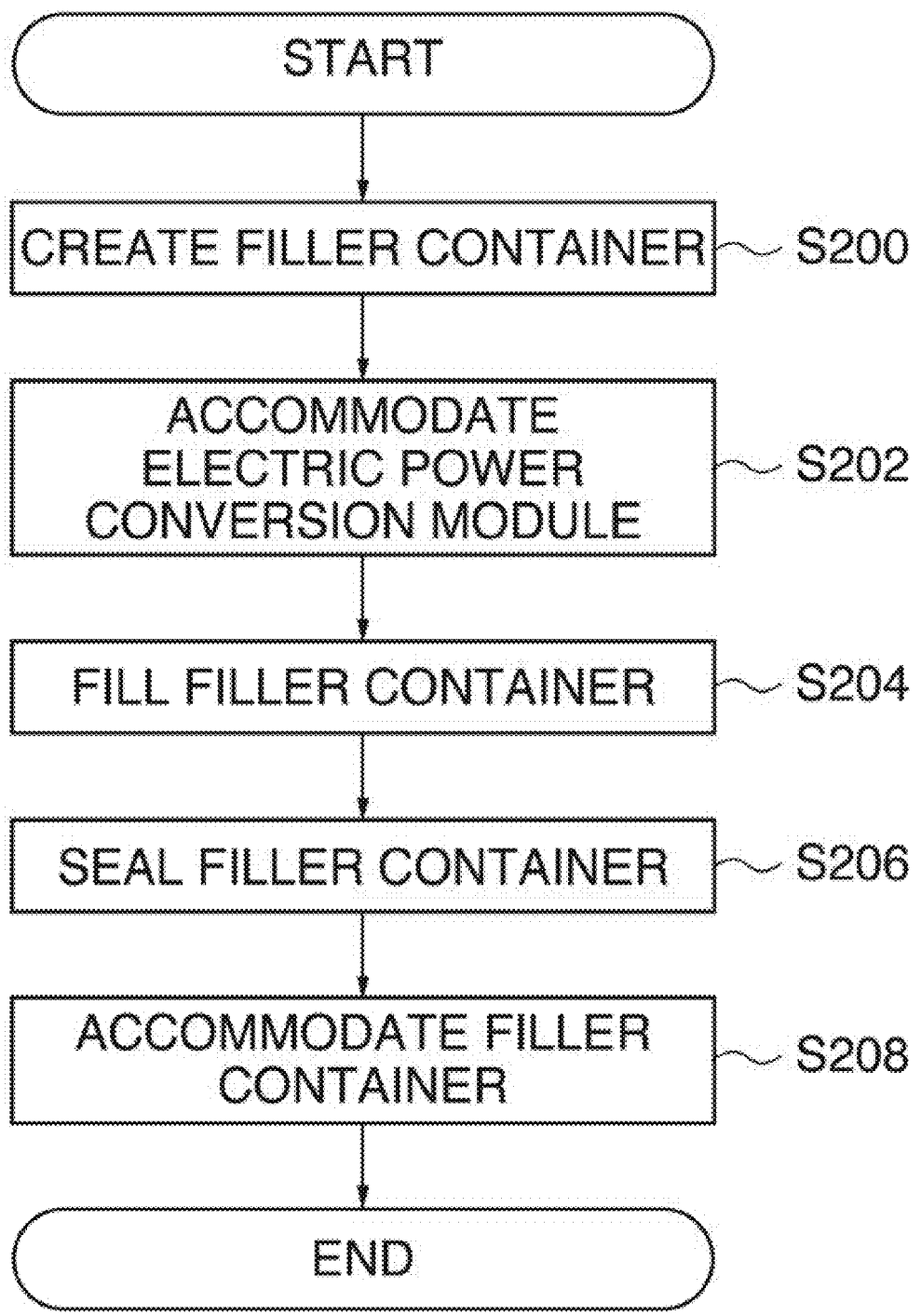
FIG. 6 is a flowchart illustrating the manufacturing method for the electric power conversion apparatus.

FIG. 6 is a flowchart illustrating the manufacturing method for the electric power conversion apparatus 110. Initially, the filler container 152 to be enclosed in the electric power conversion module 150 is created (step S200).

FIGS. 7A to 7D are schematic views illustrating a process for forming the filler container. As shown in FIG. 7A, on both sides of the aluminium film 250, PET (Poly Ethylene Terephthalate) films 252 are laminated to make a laminating film 254. The laminating film 254 is processed by compression molding using the die-and-mold 256. Accordingly, the laminating film 254 is transformed by the compression molding to a box shown in FIG. 7B. This laminating film 254 becomes a part of the filler container 152. In this embodiment, the laminating film 254 includes the aluminium film 250 but the film 254 may also include different existing materials.

As shown in FIG. 7C, the electric power conversion module 150 is accommodated by the created filler container 152

(step S202) with drawing only input and output lines 258. From the top of the container 152, it is filled with the filler 154 (step S204). Then the filler container 152 is covered by another laminating film 260 and sealed by thermo compression bonding of the film 260 in a vacuum to confine the filler 154 in the container 152 (step S206). The sealing can be carried out variously not only by thermo compression bonding but also by a sealing element such as an O-ring or by an adhesive agent. Then, as shown in FIG. 7D, the electric power conversion module 150 and the filler container 152 filled with the filler 154 are completed. Due to such sealing, even if the filler 154 is melted to be liquid, it is possible to reduce the risk that the filler 154 would be leaked outside from the filler container 152.

Since the filler 154 has electric non-conductance, it does not electrically affect the electric power conversion module 150 and other electronic parts arranged in the filler container 152, even if it is melted to be liquid.

Since the filler container 152 can be transformed freely, frames 270 may be prepared on the accommodated electric power conversion module 150 in order to maintain the form of the container 152 to some extent.

Figure 8:
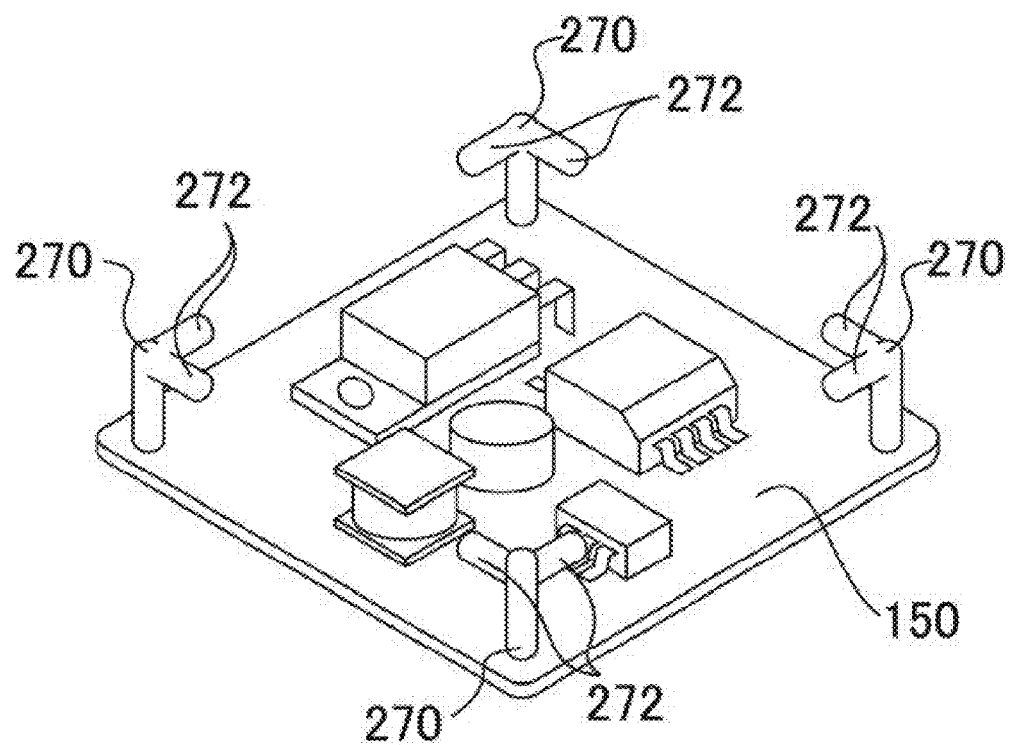
FIG. 8 is a perspective view of the electric power conversion module on which frames are prepared.
Figure 9:
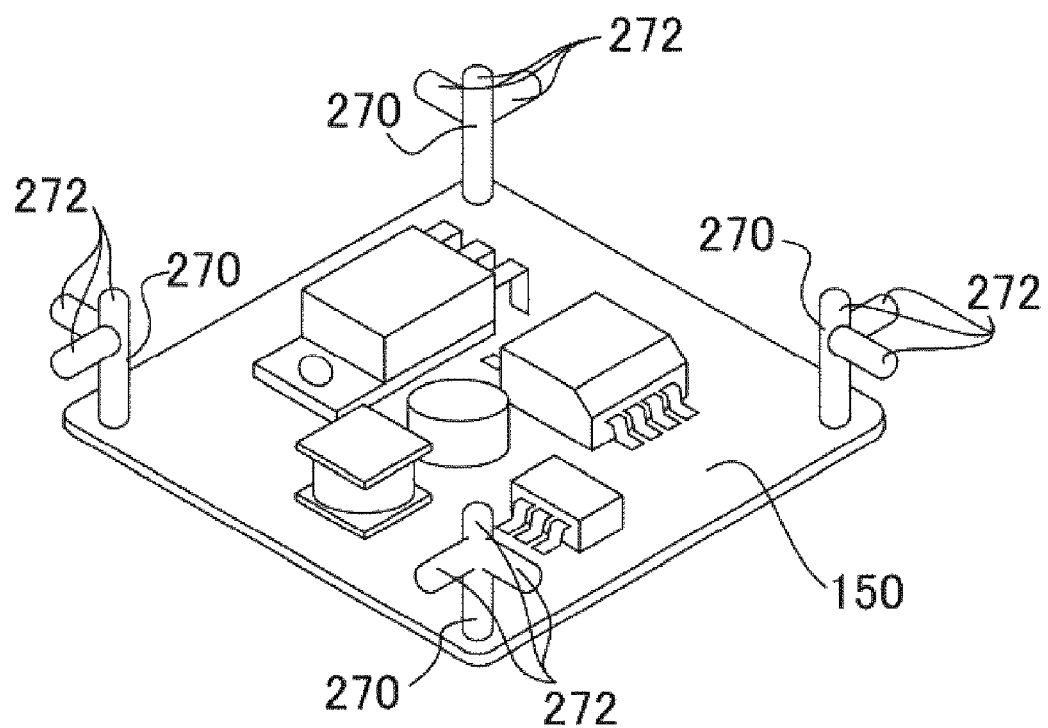
FIG. 9 is another perspective view of the electric power conversion module on which frames are prepared.

FIGS. 8 and 9 are perspective views of the electric power conversion module 150 on which frames 270 are prepared. In FIG. 8, protrusions 272 of the frames 270 are directed toward each other. In FIG. 9, protrusions 272 of the frames 270 are directed radiantly from the electric power conversion module 150. In both cases, the protrusions 272 support the filler container 152 by touching it. By preparing the frames 270 at the four corners of the electric power conversion module 150, it is possible to maintain the parallelepiped shape of the filler container 152 even when external pressure is applied to the container 152. Besides, because of the frames 270, a certain space is formed over the main surface of the electric power conversion module 150 so that the filler 154 reaches every electronic parts on the electric power conversion module 150.

Finally, input and output lines 258 are disposed appropriately and the filler container 152 is accommodated by the housing (step S208).

As explained above, according to the present embodiment, by means of a simple heat-absorbing structure using heat of fusion, a large amount of charging current can be supplied without changing a usual volume of the electric power conversion apparatus. Besides, in the case that the amount of charging current to be supplied is small, the size and weight of the electric power conversion apparatus can be reduced so that portability of the apparatus is improved.

Although the present invention has been described with reference to the preferred embodiments while referring to the accompanying drawings, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

For example, voltage of the secondary battery, which is the basis of control of the controller 160, may be measured by the mobile terminal 120, though it is measured by the voltage meter 158 of the electric power conversion apparatus 110 in the present embodiment.

Furthermore, each process in the manufacturing method for the electric power conversion apparatus described in the present description does not have to be performed in a chronological order according to the order described in the flow chart. The processes may also be performed in parallel or by a subroutine.

INDUSTRIAL APPLICATION OF THE INVENTION

The present invention can be applied to an electric power conversion apparatus for converting electric power from the commercial power supply to converted electric power and to a manufacturing method for the apparatus.

What is claimed is:

1. An electric power conversion apparatus comprising:
    an electric power conversion module for converting electric power from a commercial power supply to converted electric power;
    a filler container for accommodating said electric power conversion module;
    a filler with which said filler container is filled, said filler having electric non-conductance and directly embracing said electric power conversion module; wherein a melting point of said filler is equal to or lower than a temperature of said electric power conversion module achieved by electric power conversion;
    a temperature detector for detecting a temperature of said filler; and
    a controller for reducing output of electric power from said electric power conversion module when the temperature detected by said temperature detector is equal to or higher than the melting point of said filler and is also higher than a first temperature which is equal to or lower than a boiling point of said filler.

2. The apparatus according to claim 1, wherein said controller further restarts the output of electric power when the temperature detected by said temperature detector is equal to or lower than the second temperature which is equal to or lower than the melting point of said filler, under the condition that the output of electric power is reduced.

3. The apparatus according to claim 2, wherein said controller changes the second temperature in accordance with voltage of a secondary battery to which the converted electric power is supplied, when the temperature detected by said temperature detector is higher than the first temperature.

4. The apparatus according to claim 1, wherein said electric power conversion module is provided with frames for securing a volume of said filler which reaches every circuit on the main surface of said electric power conversion module.

5. The apparatus according to claim 1, wherein the converted electric power is electric power for charging a secondary battery.

6. A manufacturing method for an electric power conversion apparatus, comprising:
    creating a filler container;
    accommodating within the filler container an electric power conversion module for converting electric power from a commercial power supply to converted electric power;
    filling the filler container, which accommodates the electric power conversion module, with a filler having electric non-conductance;
    sealing the filler container;
    detecting a temperature of said filler; and
    reducing output of electric power from said electric power conversion module when the detected temperature is equal to or higher than a melting point of said filler and is also higher than a first temperature which is equal to or lower than a boiling point of the filler.

* * * * *